United States Patent [19]

Hölzle

[11] Patent Number: 4,825,105
[45] Date of Patent: Apr. 25, 1989

[54] CIRCUIT FOR GENERATION OF LOGIC VARIABLES, USING MULTIPLEXES AND INVERTERS

[75] Inventor: Josef Hölzle, Munich, Fed. Rep. of Germany

[73] Assignee: Siemens Aktiengesellschaft, Berlin and Munich, Fed. Rep. of Germany

[21] Appl. No.: 142,343

[22] Filed: Dec. 28, 1987

Related U.S. Application Data

[63] Continuation of Ser. No. 781,826, Sep. 30, 1985, abandoned.

[30] Foreign Application Priority Data

Sep. 28, 1984 [DE] Fed. Rep. of Germany ....... 3435774

[51] Int. Cl.$^4$ ............................................ H03K 19/02
[52] U.S. Cl. .................................... 307/440; 307/243; 307/445; 307/465
[58] Field of Search ................ 307/440, 445, 465–467, 307/243, 579, 584–585; 364/716

[56] References Cited

U.S. PATENT DOCUMENTS

| | | | |
|---|---|---|---|
| 3,428,903 | 2/1969 | Forslund et al. | 307/465 |
| 3,458,240 | 7/1969 | Hanson | 307/445 X |
| 3,576,984 | 8/1968 | Gregg, Jr. | 307/243 X |
| 3,619,583 | 11/1971 | Arnold | 307/465 X |
| 4,257,008 | 3/1981 | Shepter | 307/465 X |
| 4,556,947 | 12/1985 | Prioste et al. | 307/465 X |

OTHER PUBLICATIONS

1324 Automation and Remote Control, No. 8, Aug. 1968, pp. 1310–1314, New York, N.Y.
Electronics, vol. 42, No. 22, 27, Oct. 1969, pp. 100–105, New York, N.Y.
28a International Journal of Electronics, vol. 47, No. 3, Sep. 1979, pp. 253–266, London, GB.
The Radio and Electronic Engineer, vol. 50, No. 7, Jul. 1980, pp. 363–366, London, GB.
Murugesan, "Programmable Universal Logic Module"; Int. J. Electronics; 1976, vol. 40, No. 5, pp. 509–512.
Davis, "Sequential Logic Array"; IBM-TDB; vol. 23, No. 3, pp. 911–913; 8/1980.
Pages 398–403 of K. Steinbuch and W. Rupprecht, entitled "Nachrichtentechnik" (Technical News) vol. 2, 1973, Springer Publishers, Berlin, Heidelberg, New York.

Primary Examiner—David Hudspeth
Attorney, Agent, or Firm—Herbert L. Lerner; Laurence A. Greenberg

[57] ABSTRACT

A circuit for the generation of combinatorial logic variables, having multiplexers and inverters, which has, for each input state defined by a combination of input variables, a uniquely defined output state defined by at least one output variable including first input variables of lower weighting; blocks of intermediate variables of the same size generated by the input variables of lower weighting, forming with logic combinations having switching behavior determined by further input variables of higher weightings.

8 Claims, 2 Drawing Sheets

CIRCUIT FOR GENERATION OF LOGIC VARIABLES, USING MULTIPLEXES AND INVERTERS

This application is a continuation Ser. of application Ser. No. 781,826 filed Sept. 30, 1985 and now abandoned.

BACKGROUND OF THE INVENTION

The invention relates to a circuit for the generation of combinatorial logic with multiplexers and inverters, wherein each output state is uniquely defined by a combination of at least the input variable.

Circuits for combinatorial logic generation are part of the basic digital technology circuits that are realizable, according to the state of the art, with two-stage OR-AND or AND-OR gate arrangements, or by means of multiplexers and inverters. A basic requirement for the design of such circuits is the use of a minimum of switching elements within reasonable expenditure of time. As a rule, either minterms, i.e. conjunctions, or maxterms, i.e. disjunctions, of all variables are employed to solve the respective problem. Either those minterms which effect a high logic level in their desired function or those maxterms whose desired function has a low logic level are used.

Boolean algebra, the McCluskey method, or the Karnaugh diagrams, described in the book by K. Steinbuch and W. Rupprecht: "Nachrichten-Technik", 2nd edition, 1973, Springer-Verlag, Berlin, Heidelberg, New York, offer possibilities to minimize the circuit complexity. Multiplexer circuits, which in today's technologies have special hardware realizations, are usually minimized through computer algorithms such as described in the paper by A. B. Ektare and D. P. Mital "Simple Algorithm for Logic Design Using Multiplexers" in "The Radio and Electronic Engineer", Vol. 50 (1980), No. 7, pages 363 to 366.

The known circuit complexity minimization methods are either cumbersome, time consuming, or restricted to a certain number of input variables. The Boolean algebra employs purely formal methods without system, and the McCluskey method, while being schematic, is complicated; Karnaugh diagrams are easy to handle only up to five input variables, and determining the best control variables in multiplexer circuits requires either computer time or much time to find the solution by hand.

SUMMARY OF THE INVENTION

The invention has the object of solving the problem by means of a multiplexer circuit for combinatorial logic generation which works with a minimum of switching elements at a minimum expenditure of time for its design.

According to the invention, this problem is solved in a circuit of the kind described at the outset.

In one embodiment of the invention the generation of combinatorial logic with multiplexers and inverters is provided which has, for each input state defined by a combination of input variables, a uniquely defined output state defined by at least one output variable. The input variables ($E_i$) of the lowest binary weighting each ($E_0$, $E_1$; $E_2$, $E_3$) serve for the generation of blocks ($A_1$; $A_1'$) of the same size with logic combinations whose switching behavior is determined by the input variables of higher binary weightings ($E_2$, $E_3$; $E_4$, $E_5$).

In accordance with another feature of the invention, the circuit is based on dual binary logic.

In accordance with an added feature of the invention, the blocks are formed of combinations of 4 bits each.

In accordance with an additional feature of the invention, the bit combinations of the blocks ($A_i$; $A_i'$) which are defined by the input variables of the respective lowest binary weighting ($E_0$, $E_1$; $E_2$, $E_3$) and a logic low and high level and that an input variable ($E_1$) applied to the address inputs (G) of multiplexers controls the switching behavior of the other input variables ($E_0$) applied to associated data inputs (0, 1) and/or of the low or high level.

In accordance with again another feature of the invention, the input variables of higher binary weighting ($E_2$, $E_3$; $E_4$, $E_5$) control address inputs of multiplexers (1, 2; 20 to 27).

In accordance with again an added feature of the invention, the blocks ($A_i$; $A_i'$) from whose combinations the output states ($S_1$, $S_2$; $B_2$, $B_1$, $B_0$) associated with the possible input states can be formed are applied to the data inputs (0, 1, 2, 3; 0, 1) of the multiplexers (1, 2; 20 to 27) controlled by the input variables of higher weighting ($E_2$, $E_3$; $E_4$, $E_5$).

In accordance with again a further feature of the invention, the blocks with those 4 bit combinations whose combinations indicate the output states ($S_1$, $S_2$) for the input states defined by the input variables ($E_0$ to $E_3$) are applied to the data inputs (0, 1, 2, 3) of the multiplexers (1, 2) controlled by the input variables of the weightings $2^2$ and $2^3$ ($E_2$, $E_3$).

In accordance with still another feature of the invention, the input variables of weightings greater than $2^3$ ($E_0$ to $E_5$) are involved, the input variables with weightings greater than $2^1$ ($E_2$ to $E_5$) are decoded in stages in order to address the block ($A_i$) associated with four each consecutive input states and resulting in the output states.

In accordance with a concomitant feature of the invention, those blocks ($A_i$) generated by the input variables of the weightings $2^0$ and $2^1$ ($E_0$, $E_1$) from whose combination the output states (S) of the circuit are formed are applied to the data inputs (0, 1, 2, 3) of the last multiplexer stage (10 to 12). In this way, there are applied to this stage coded output variables ($B_2$, $B_1$, $B_0$) of the next to the last multiplexer stage (20 to 27) which are defined by dual coding, in ascending order, of the blocks controlled by the binary weighting $2^0$ and $2^1$ ($E_0$, E) and which control the multiplexers of the last stage (10 to 12) to address the block ($A_i$) which in turn determine the four, each consecutive, output stages of the circuit, and wherein the at most four binary weightings of the output variables ($B_i$) of the next to the last multiplexer stage (20 to 27) are again combined to blocks ($A_i'$) of 4 bits. These are applied to the data inputs (0, 1) of the next to the last multiplexer stage (20 to 27) and are now generated, corresponding to the blocks ($A_i$) generated by the input variables of the binary weightings $2^0$ and $2^1$ ($E_0$, $E_1$), by the input variables of the binary weightings $2^2$ and $2^3$ ($E_2$, $E_3$) and are switched through for the generation of coded output variables ($B_2$, $B_1$, $B_0$) with maximally four binary weightings, so that the address inputs (G) of the next to the last multiplexer stage (20 to 27) are controlled by again coded output variables of the next to the last multiplexer stage. The output variables are generated in accordance with the coding of the output variables ($B_2$, $B_1$, $B_0$) of the next to the last stage (20 to 27) and progress stepwise in this manner until the input variables of the binary weightings $2^{n-1}$ and $2^n$ ($E_4$, $E_5$) remain for the address inputs (G) of the multiplexers (20 to 27) of the last stage.

The embodiments of the inventive idea are defined in the claims.

The invention is explained below in greater detail with reference to three figures in which identical elements have the same reference symbols.

Other features which are considered as characteristic for the invention are set forth in the appended claims.

Although the invention is illustrated and described herein as embodied in a circuit for logic generation with multiplexers, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The construction and method of operation of the invention, however, together with additional objects and advantages thereof will be best understood from the following description of specific embodiments when read in connection with the accompanying drawings, in which.

DESCRIPTION OF THE PREFERRED EMBODIMENTS

Figure 1:
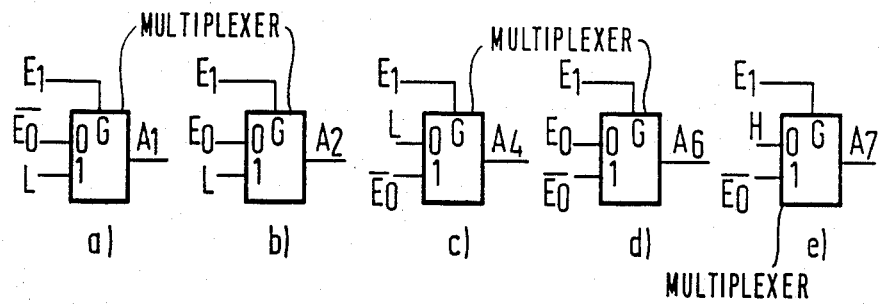
FIG. 1 shows embodiment examples for the blocks of equal size with logic combinations, to be generated from input variables of respectively lowest weighting.

The idea underlying the invention is to generate, by means of the input variables of respectively lowest binary weighting, blocks of equal size forming logic combinations. The possible output states result from a combination of these blocks. The blocks occupy the data inputs of a multiplexer circuit and are switched through to the multiplexer circuit output in the combinations of the input variables to which the logic combinations of the blocks are assigned. The selection of the respectively correct block is determined by the input variables of higher binary weighting which occupy the address inputs of the multiplexer circuit.

Besides the little time consumed in minimizing the switching elements required, the easy changeability of the desired function which indicates the output states determined by the input states represents another advantage of the circuit according to the invention. When needed, all that is necessary is to exchange the blocks applied to the data inputs of the multiplexer circuits. Further advantages of the circuit according to the invention are seen in that up to eight input variables can be handled very easily without computer and in that the switching time becomes independent of the function of the output variables. Advantageous fields of application for such multiplexer circuits are gate arrays, especially in ECL technology.

For use in dual binary logic, standard multiplexers are available which have either one address input and two data inputs or two address inputs and four data inputs, with one output each. The logic state of a control variable applied to the address inputs determines which ones of the variables applied to the data inputs are to be switched through to the output. For example, the address variables 00, 01, 10, 11 control, in this sequence, the data inputs 0, 1, 2, 3 associated with them. The fan-out is up to 10, but at higher output loads buffer amplifers are required. Due to the special hardware realization used for the multiplexers, the output variables are usually available inverted also; otherwise, inverters are required, as for the input variables.

Now, according to the invention, the input variables of respectively lowest binary weighting serve for the generation of blocks of 4-bit size with 16 different combinations resulting from the variation of the bits.

While the generation of the larger blocks, e.g. of 8 bits, is also possible, it becomes impractical to handle the 256 combinations then resulting. The combinations of the 4-bit blocks of intermediate variables $A_0$ to $A_{15}$ listed below can be generated by means of the two input variables of lowest binary weighting $E_0$ and $E_1$.

TABLE 1

| $E_1$ | $E_0$ | $A_0$ | $A_1$ | $A_2$ | $A_3$ | $A_4$ | $A_5$ | $A_6$ | $A_7$ | $A_8$ | $A_9$ | $A_{10}$ | $A_{11}$ | $A_{12}$ | $A_{13}$ | $A_{14}$ | $A_{15}$ |
|---|---|---|---|---|---|---|---|---|---|---|---|---|---|---|---|---|---|
| 0 | 0 | 0 | 1 | 0 | 1 | 0 | 1 | 0 | 1 | 0 | 1 | 0 | 1 | 0 | 1 | 0 | 1 |
| 0 | 1 | 0 | 0 | 1 | 1 | 0 | 0 | 1 | 1 | 0 | 0 | 1 | 1 | 0 | 0 | 1 | 1 |
| 1 | 0 | 0 | 0 | 0 | 0 | 1 | 1 | 1 | 1 | 0 | 0 | 0 | 0 | 1 | 1 | 1 | 1 |
| 1 | 1 | 0 | 0 | 0 | 0 | 0 | 0 | 0 | 0 | 1 | 1 | 1 | 1 | 1 | 1 | 1 | 1 |

The index i designating the blocks $A_i$ of intermediate variables corresponds in the decimal number system to the bit combination of the associated block in the binary number code. The blocks $A_{15}$ to $A_8$ follow in this sequence from the inversion of the blocks $A_0$ to $A_7$. The block $A_0$ represents the logic low level, and the blocks $A_3$ and $A_5$ are the inversions of the input variables $E_1$ and $E_0$. The logic low or high level and the input variables $E_0$ and $E_1$ need not be generated separately because they must necessarily be available for a circuit according to the invention. Assuming that each bit sequence is available also in inverted form or was generated by inversion, there remain five blocks which must be generated by means of multiplexers.

FIG. 1 represents the five associated circuits in the part figures a to e under the assumption that the input variable $E_1$ is the control variable. There then remain for the data inputs 0 and 1 the logic low or high level and the input variable $E_0$. FIG. 1a corresponds to block $A_1$: At the logic low level of the address input G or the input variable $E_1$ the inverted input variable becomes $E_0$; at the logic high level of the address input G the logic low level is connected to the output. Correspondingly, the circuit per FIG. 1b generates the block $A_2$, per FIG. 1c the block $A_4$, per FIG. 1d the block $A_6$, and per FIG. 1e the block $A_7$.

The blocks can be generated just as readily when instead of the input variable $E_1$ the input variable $e_0$ occupies the address input G. In that case, Block $A_1$ can be generated by the inverted input variable $E_1$ at the data input 0 and the logical low level at the data input 1 of a multiplexer. Thus, the realization of all 16 output combinations of the blocks $A_0$ to $A_{15}$ is possible by means of 5 multiplexers, each with two data inputs and one output, and the inversion of the outputs. It is assumed for the further description that the blocks $A_0$ to $A_{15}$ are generated and are available for data inputs.

In the first embodiment example of a circuit according to the invention, the input stages defined by the possible combinations of four input variables $E_0$ to $E_3$ are to lead to two output states, each represented by one output variable. The output states are specified by the desired functions $S_1$ and $S_2$. The problem may also be interpreted as the generation of one output state with two output variables each. The binary weighting of the input variables is as indicated by their index, the input variable $E_0$, for instance, having the binary weighting $2^0$, the input variable $E_1$ the binary weighting $2^1$, etc.. The output states associated with the combinations of the input variables are listed below.

TABLE 2

| $E_3$ | $E_2$ | $E_1$ | $E_0$ | $S_1$ | | $S_2$ | |
|---|---|---|---|---|---|---|---|
| 0 | 0 | 0 | 0 | 1 | | 0 | |
| 0 | 0 | 0 | 0 | 0 | | 1 | |
| | | | | | $A_{13}$ | | $A_{10}$ |
| 0 | 0 | 1 | 0 | 1 | | 0 | |
| 0 | 0 | 1 | 1 | 1 | | 1 | |
| 0 | 1 | 0 | 0 | 0 | | 0 | |
| 0 | 1 | 0 | 1 | 0 | | 1 | |
| | | | | | $A_4$ | | $A_6$ |
| 0 | 1 | 1 | 0 | 1 | | 1 | |
| 0 | 1 | 1 | 1 | 0 | | 0 | |
| 1 | 0 | 0 | 0 | 0 | | 1 | |
| 1 | 0 | 0 | 1 | 1 | | 0 | |
| | | | | | $A_2$ | | $A_1$ |
| 1 | 0 | 1 | 0 | 0 | | 0 | |
| 1 | 0 | 1 | 1 | 0 | | 0 | |
| 1 | 1 | 0 | 0 | 1 | | 0 | |
| 1 | 1 | 0 | 1 | 0 | | 1 | |
| | | | | | $A_5$ | | $A_{14}$ |
| 1 | 1 | 1 | 0 | 1 | | 1 | |
| 1 | 1 | 1 | 1 | 0 | | 1 | |

According to the invention, the successive output states of the output variables are divided into 4-bit blocks. Thus, the output state of the desired function $S_1$ associated with the decimal input states 0 to 3 corresponds to the block $A_{13}$ and the output state of the desired function $S_2$ to the block $A_{10}$. As the above table indicates, the output states associated with the rest of the input states are handled correspondingly.

Figure 2:
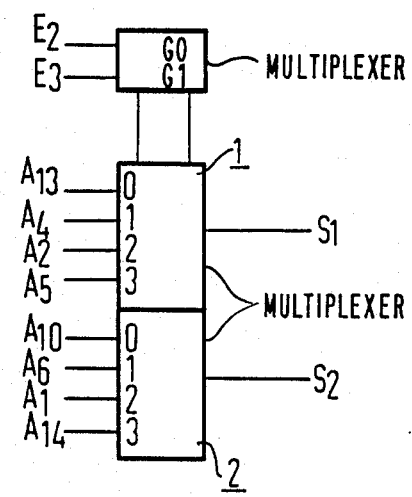
FIG. 2 shows an embodiment example of a circuit according to the invention with four input variables.

The input variables $E_0$ and $E_1$ were already used to generate the blocks $A_0$ to $A_{15}$. There remain the input variables $E_2$ $E_3$ which occupy the address inputs of a multiplexer with four data inputs. Applied to the multiplexer data inputs are those blocks $A_i$ listed in the above table which result in the desired functions $S_1$ and $S_2$ if appropriately controlled by the input variables $E_2$ and $E_3$. Two multiplexers, each with four data inputs and one output, are required for the two desired functions, each defined by four blocks. FIG. 2 shows the circuit according to the invention pertaining thereto.

In each one of the four possible states of the address inputs A0 and A1 a complete block applied to the multiplexer 1 and 2 data inputs 0 to 3 associated with them must be connected to the output. Although no special decoder is required, decoding of the input variables $E_2$ and $E_3$ occurs solely in that they drive the address inputs A0 and A1 of the binary weightings $2^0$ and $2^1$. Therefore, in the 00 state of the input variables $E_2$ and $E_3$, the data inputs 0 of the multiplexers 1 and 2 assigned to them, with the blocks $A_{13}$ and $A_{10}$, can be switched through to the output. Triggering the data inputs 0 to 3 of the multiplexers 1 and 2, occurring in ascending order of the address inputs A0 and A1 or of the input variables $E_2$ and $E_3$, then results in the desired function $S_1$ in the multiplexer 1 and $S_2$ in the multiplexer 2.

Compared with realizations of these desired functions $S_1$ and $S_2$ possible by the prior art using minterms and maxterms, the circuit according to the invention as shown in FIG. 2 requires fewer or at the most as many components and less or at the most as much space. The desired function is modified simply by rerouting the blocks applied to the data inputs of the multiplexers.

The advantages of a circuit according to the invention usually bear fruit only when there are more than four input variables, as is demonstrated for the second embodiment example with 6 input variables. A special decoder to drive the multiplexers is required in the second embodiment example. In this case, the desired function S to be generated and defined by one output variable is again divided into blocks of 4 bits each for the input and output states in the following coordination table.

Corresponding to the $2^6=64$ input states and, hence, 64 output states are 16 blocks of 4 bits each. In the case of the example, of the 16 possible blocks defined by the input variables $E_0$ and $E_1$, there are seven different blocks. The switching behavior of these blocks is determined by the input variables $E_2$ to $E_5$. Since a maximum of two input variables can address a multiplexer, a decoder is required in the case of the example.

TABLE 3

| $E_5$ | $E_4$ | $E_3$ | $E_2$ | $E_1$ | $E_0$ | S | | $E_5$ | $E_4$ | $E_3$ | $E_2$ | $E_1$ | $E_0$ | S | |
|---|---|---|---|---|---|---|---|---|---|---|---|---|---|---|---|
| 0 | 0 | 0 | 0 | 0 | 0 | 0 | | 1 | 0 | 0 | 0 | 0 | 0 | 0 | |
| 0 | 0 | 0 | 0 | 0 | 1 | 1 | | 1 | 0 | 0 | 0 | 0 | 1 | 1 | |
| | | | | | | | $A_2$ | | | | | | | | $A_{10}$ |
| 0 | 0 | 0 | 0 | 1 | 0 | 0 | | 1 | 0 | 0 | 0 | 1 | 0 | 0 | |
| 0 | 0 | 0 | 0 | 1 | 1 | 0 | | 1 | 0 | 0 | 0 | 1 | 1 | 1 | |
| 0 | 0 | 0 | 1 | 0 | 0 | 0 | | 1 | 0 | 0 | 1 | 0 | 0 | 1 | |
| 0 | 0 | 0 | 1 | 0 | 1 | 1 | | 1 | 0 | 0 | 1 | 0 | 1 | 1 | |
| | | | | | | | $A_2$ | | | | | | | | $A_7$ |
| 0 | 0 | 0 | 1 | 1 | 0 | 0 | | 1 | 0 | 0 | 1 | 1 | 0 | 1 | |
| 0 | 0 | 0 | 1 | 1 | 1 | 0 | | 1 | 0 | 0 | 1 | 1 | 1 | 0 | |
| 0 | 0 | 1 | 0 | 0 | 0 | 1 | | 1 | 0 | 1 | 0 | 0 | 0 | 1 | |
| 0 | 0 | 1 | 0 | 0 | 1 | 1 | | 1 | 0 | 1 | 0 | 0 | 1 | 0 | |
| | | | | | | | $A_7$ | | | | | | | | $A_{13}$ |
| 0 | 0 | 1 | 0 | 1 | 0 | 1 | | 1 | 0 | 1 | 0 | 1 | 0 | 1 | |
| 0 | 0 | 1 | 0 | 1 | 1 | 0 | | 1 | 0 | 1 | 0 | 1 | 1 | 1 | |
| 0 | 0 | 1 | 1 | 0 | 0 | 0 | | 1 | 0 | 1 | 1 | 0 | 0 | 0 | |
| 0 | 0 | 1 | 1 | 0 | 1 | 0 | | 1 | 0 | 1 | 1 | 0 | 1 | 1 | |
| | | | | | | | $A_8$ | | | | | | | | $A_2$ |
| 0 | 0 | 1 | 1 | 1 | 0 | 0 | | 1 | 0 | 1 | 1 | 1 | 0 | 0 | |
| 0 | 0 | 1 | 1 | 1 | 1 | 1 | | 1 | 0 | 1 | 1 | 1 | 1 | 0 | |
| 0 | 1 | 0 | 0 | 0 | 0 | 0 | | 1 | 1 | 0 | 0 | 0 | 0 | 0 | |

TABLE 3-continued

| E5 | E4 | E3 | E2 | E1 | E0 | S | | E5 | E4 | E3 | E2 | E1 | E0 | S | |
|---|---|---|---|---|---|---|---|---|---|---|---|---|---|---|---|
| 0 | 1 | 0 | 0 | 0 | 1 | 1 | A6 | 1 | 1 | 0 | 0 | 0 | 1 | 0 | A8 |
| 0 | 1 | 0 | 0 | 1 | 0 | 1 | | 1 | 1 | 0 | 0 | 1 | 0 | 0 | |
| 0 | 1 | 0 | 0 | 1 | 1 | 0 | | 1 | 1 | 0 | 0 | 1 | 1 | 1 | |
| 0 | 1 | 0 | 1 | 0 | 0 | 0 | | 1 | 1 | 0 | 1 | 0 | 0 | 1 | |
| 0 | 1 | 0 | 1 | 0 | 1 | 1 | A10 | 1 | 1 | 0 | 1 | 0 | 1 | 1 | A11 |
| 0 | 1 | 0 | 1 | 1 | 0 | 0 | | 1 | 1 | 0 | 1 | 1 | 0 | 0 | |
| 0 | 1 | 0 | 1 | 1 | 1 | 1 | | 1 | 1 | 0 | 1 | 1 | 1 | 1 | |
| 0 | 1 | 1 | 0 | 0 | 0 | 1 | | 1 | 1 | 1 | 0 | 0 | 0 | 0 | |
| 0 | 1 | 1 | 0 | 0 | 1 | 1 | A11 | 1 | 1 | 1 | 0 | 0 | 1 | 1 | A6 |
| 0 | 1 | 1 | 0 | 1 | 0 | 0 | | 1 | 1 | 1 | 0 | 1 | 0 | 1 | |
| 0 | 1 | 1 | 0 | 1 | 1 | 1 | | 1 | 1 | 1 | 0 | 1 | 1 | 0 | |
| 0 | 1 | 1 | 1 | 0 | 0 | 1 | | 1 | 1 | 1 | 1 | 0 | 0 | 0 | |
| 0 | 1 | 1 | 1 | 0 | 1 | 0 | A13 | 1 | 1 | 1 | 1 | 0 | 1 | 1 | A2 |
| 0 | 1 | 1 | 1 | 1 | 0 | 1 | | 1 | 1 | 1 | 1 | 1 | 0 | 0 | |
| 0 | 1 | 1 | 1 | 1 | 1 | 1 | | 1 | 1 | 1 | 1 | 1 | 1 | 0 | |

For the design of the decoder, the distinguishable, i.e. uniquely identifiable, blocks are binary coded in ascending order.

TABLE 4

| Block | $B_2$ | $B_1$ | $B_0$ |
|---|---|---|---|
| $A_2$ | 0 | 0 | 0 |
| $A_7$ | 0 | 0 | 1 |
| $A_8$ | 0 | 1 | 0 |
| $A_6$ | 0 | 1 | 1 |
| $A_{10}$ | 1 | 0 | 0 |
| $A_{11}$ | 1 | 0 | 1 |
| $A_{13}$ | 1 | 1 | 0 |

Assigned to the distinguishable blocks $A_i$ are the code variables $B_0$ to $B_2$ of the weightings $2^0$ to $2^2$. Each code word defined by the code variables $B_0$ to $B_2$ stands for four output states defined by the input variables $E_0$ and $E_1$. A maximum of 4 code variables $B_i$ is required for the greatest number of 16 distinguishable blocks $A_i$ which can occur. Consequently, the decoder can handle 4 input variables and be built as a single stage unit, analogous to the case treated in the first embodiment example. At more than six input variables, those having weightings greater than $2^1$ are decoded in several stages. By means of the decoded variables, the last multiplexer stage connects the blocks, generated by $E_o$ and E, to the output.

In the present embodiment example, the output states defined by the coded output variables = code variables $B_0$ to $B_2$ are associated with the input variables $E_2$ to $E_5$. Each code variable $B_i$ can be considered as a desired function to be realized. Corresponding to the first embodiment example, the input variables $E_2$ and $E_3$ assume for the decoder the task of generating blocks of 4 bits each. These blocks are applied to the data inputs of the decoder multiplexers addressed by the input variables $E_4$ and $E_5$. In the embodiment example, the decoder has 3 outputs, each associated with one code variable $B_i$ and driving the succeeding multiplexers to whose data inputs are applied to the blocks generated by the input variables $E_0$ and $E_1$. The result is the following relationship, which also contains the actual desired function S to be generated, in the form of the blocks generated by the input variables $E_0$ and $E_1$.

TABLE 5

| $E_5$ | $E_4$ | $E_3$ | $E_2$ | $B_2$ | $B_1$ | $B_0$ | $B_2$ | $B_1$ | $B_0$ | S ($E_1$, $E_0$) |
|---|---|---|---|---|---|---|---|---|---|---|
| 0 | 0 | 0 | 0 | 0 | 0 | 0 | $A_0'$ | $A_8'$ | $A_4'$ | $A_2$ |
| 0 | 0 | 0 | 1 | 0 | 0 | 0 | | | | $A_2$ |
| 0 | 0 | 1 | 0 | 0 | 0 | 1 | | | | $A_7$ |
| 0 | 0 | 1 | 1 | 0 | 1 | 0 | | | | $A_8$ |
| 0 | 1 | 0 | 0 | 0 | 1 | 1 | $A_{14}'$ | $A_9'$ | $A_5'$ | $A_6$ |
| 0 | 1 | 0 | 1 | 1 | 0 | 0 | | | | $A_{10}$ |
| 0 | 1 | 1 | 0 | 1 | 0 | 1 | | | | $A_{11}$ |
| 0 | 1 | 1 | 1 | 1 | 1 | 0 | | | | $A_{13}$ |
| 0 | 1 | 0 | 0 | 0 | 1 | 0 | $A_5'$ | $A_4'$ | $A_2'$ | $A_{10}$ |
| 1 | 0 | 0 | 1 | 0 | 0 | 1 | | | | $A_7$ |
| 1 | 0 | 1 | 0 | 1 | 1 | 0 | | | | $A_{13}$ |
| 1 | 0 | 1 | 1 | 0 | 0 | 0 | | | | $A_2$ |
| 1 | 1 | 0 | 0 | 0 | 1 | 0 | $A_2'$ | $A_5'$ | $A_6'$ | $A_8$ |
| 1 | 1 | 0 | 1 | 1 | 0 | 1 | | | | $A_{11}$ |
| 1 | 1 | 1 | 0 | 0 | 1 | 1 | | | | $A_6$ |
| 1 | 1 | 1 | 1 | 0 | 0 | 0 | | | | $A_2$ |

In this case, the code variable or coded output variable $B_2$ of the decoder can be presented by the blocks $A_0'$, $A_{14}'$, $A_5'$ and $A_2'$. The ' is to indicate that these blocks, although having the same bit sequence as the blocks generated by the input variables $E_0$ and $E_1$, are generated in this case by the input variables $E_2$ and $E_3$. The two input variables $E_4$ and $E_5$ can now be used as address inputs for multiplexers because there is only a maximum of 16 different blocks $A_i'$. In this case, 12 blocks are used.

Now, the decoder belonging to the second embodiment example may be designed like the circuit according to the invention of the first embodiment example.

Figure 3:
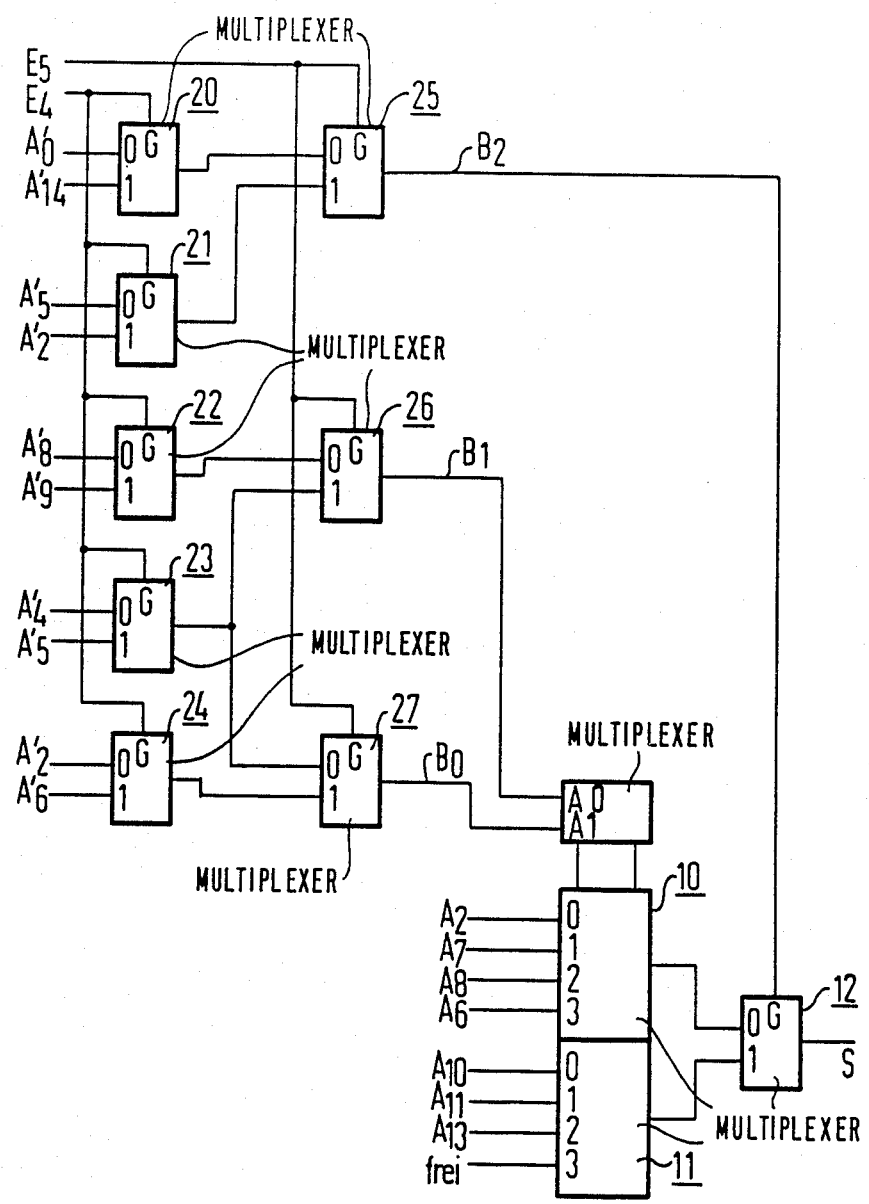
FIG. 3 shows an embodiment example of a circuit according to the invention with six variables.

But in the circuit according to the invention as shown in FIG. 3 another avenue is chosen, resulting directly from the coordination table for the blocks $A_i'$. Therein, the input variable $E_4$ controls the address inputs of five multiplexers 20 to 24 with two data inputs 0 and 1 each. Since the blocks $A_4'$ and $A_5'$ are coordinated twice equally with the states of the input variables $E_4$ only five multiplexers driven by $E_4$ are sufficient.

Starting at the highest weighting of the code variables $B_i$, the blocks $A_i'$ are applied in ascending order relative to the input variables $E_4$ and $E_5$ to the data inputs 0 and 1 of the multiplexers 20 to 24. Since two blocks each are associated with each logic state of the input variables $E_5$, the outputs of the multiplexers controlled by $E_4$ represent at the same time the data inputs 0 and 1 of the succeeding multiplexers 25 to 27 controlled by $E_5$. The exception are the blocks $A_4'$ and $A_5'$ controlled by $E_4$ and coordinated, on the one hand, with the low level of $E_5$ for the generation of the code variables $B_0$ and, on the other hand, with the high level of $E_5$ for the generation of the code variables $B_1$. The code variables $B_0$, $B_1$ and $B_2$ are then available at the decoder output.

For the seven distinguishable blocks $A_i$ coordinated with the input variables $E_0$ to $E_5$ two multiplexers 10 and 11 with four data inputs 0 to 3 each are needed in the last multiplexer stage of the circuit. The address inputs A0 and A1 for these multiplexers occupy the lowest weighting code variables, namely $B_0$ and $B_1$. The choice between the blocks switched through by these code variables to the output of the multiplexers 10 and 11 is made by a multiplexer 12 of the last multiplexer stage with two data inputs 0 and 1 controlled by the code variable $B_2$. The desired function S for the 6 input variables $E_0$ to $E_5$ is then available at the output of this multiplexer.

A circuit with more than eight blocks controlled by the input variables $E_0$ and $E_1$ looks similar thereto because four code variables $B_i$ of different weightings will then serve as address inputs. For more than 6 input variables $E_i$ the decoder design is repeated stepwise until the input variables of the weighting $2^{n-1}$ and $2^n$ remain as address inputs for multiplexers.

The foregoing is a description corresponding in substance to German Application P 34 35 774.2, dated Sept. 28, 1984, the International priority of which is being claimed for the instant application, and which is hereby made part of this application. Any material discrepancies between the foregoing specification and the aforementioned corresponding German application are to be resolved in favor of the latter.

I claim:

1. Circuit for the generation of combinatorial logic variables, formed of multiplexers having multiple data and address inputs and multiple binary input and output states and inverters, said circuit having for each input state defined by a combination of input variables of lowest binary weight, a uniquely defined output state defining at least one output variable, said circuit comprising first means for receiving a plurality of first input variables of lowest binary weight; second means connected to said first means for generating intermediate variables of equal binary weight
   being a logic function of the input variables of lowest binary weight, and third means connected to said second means including logic combinations having further input variables of higher binary weights to generate said at least one output variable.

2. Circuit according to claim 1, wherein said intermediate variables have binary weights equal to four 3. Circuit according to claim 1,
   wherein the intermediate variables are further defined by the input variables of the lowest binary weight and by at least one further input variable of higher binary weight, logic low and high level multiplexers having address inputs controlled by the further input variable, and data means for receiving said first input variables of the lower binary weight.

4. Circuit according to claim 1 wherein said third means include multiplexers having address inputs for receiving said input variables of higher binary weight.

5. Circuit according to claim 4, wherein the intermediate variables are each defined as a combination of the input states, and are applied to the data inputs of the multiplexers controlled by the input variables of higher binary weights.

6. Circuit according to claim 5
   including further intermediate variables each having four bit combinations, said each
   further intermediate variables having at least two output states, defined by said first variables, said further intermediate variables being applied to the data inputs of the multiplexers controlled by said further input variables having lowest binary weights 7. Circuit according to claim 5, including input variables having binary weights greater than $2^3$, the input variables having binary weights greater than $2^1$ being decoded in stages for addressing the intermediate variables.

8. Circuit according to claim 7, including a last and a next to last multiplexer stage, wherein at data inputs of the last multiplexer stage the blocks generated by the input variables having weights adjacent to the weights $2^0$ and $2^1$ form further intermediate variables, and wherein at the address inputs adjacent to the last multiplexer stage coded output variables of the next to last multiplexer stage ar defined by the input variables having weights $2^0$ and $2^1$, wherein the multiplexer of the last stage control four consecutive output variables for the selection of the respective determining block, wherein no more than four weights of the output variables of the next to last multiplexer stage respectively are being combined, which are adjacent to the data inputs of the next to last multiplexer stage, and wherein respective blocks of the input variables with the weights $2^0$ and $2^1$ ($E_0$, $E_1$) are generated by the input variables of the weights $2_2$ and $2^3$, said input variables of weights $2^2$ and $2^3$ being connected through for generation of coded output variables having a maximum of four weights, wherein the address inputs of the next to last multiplexer stage are again controlled by coded output variables of th second to last multiplexer stage, said coded variables are generated corresponding to the coding of the output variables of the next to last stage, and stage-by-stage progressing in such a way, until only the input variables of the weights $2^{n-1}$ and $2^n$ for multiplexer address inputs remain.

* * * * *